United States Patent [19]
Fuji

[11] Patent Number: 5,577,003
[45] Date of Patent: Nov. 19, 1996

[54] DECODING CIRCUIT FOR USE IN SEMICONDUCTOR READ ONLY MEMORY

[75] Inventor: Yukio Fuji, Kanagawa, Japan

[73] Assignee: NEC Corporation, Tokyo, Japan

[21] Appl. No.: 448,857

[22] Filed: May 24, 1995

[30] Foreign Application Priority Data

May 24, 1994 [JP] Japan ..................................... 6-109858

[51] Int. Cl.$^6$ ...................................................... G11C 8/00
[52] U.S. Cl. .................................. 365/230.01; 365/230.06
[58] Field of Search ........................ 365/230.03, 230.06, 365/190, 230.01

[56] References Cited

U.S. PATENT DOCUMENTS

| | | | |
|---|---|---|---|
| 5,159,215 | 10/1992 | Murotani | 365/230.06 |
| 5,297,084 | 3/1994 | Ban | 365/230.06 |
| 5,440,518 | 8/1995 | Hazani | 365/230.03 |

FOREIGN PATENT DOCUMENTS

| | | | |
|---|---|---|---|
| 0277695 | 12/1987 | Japan | 365/230.06 |
| 4-95298 | 3/1992 | Japan . | |
| 5-347094 | 12/1993 | Japan . | |

*Primary Examiner*—David C. Nelms
*Assistant Examiner*—Trong Phan
*Attorney, Agent, or Firm*—Foley & Lardner

[57] ABSTRACT

A decoding circuit for use in a semiconductor read only memory includes a predecoding unit receiving a first address signal group of a given address, for generating a plurality of word selection driving signals, and a plurality of decoder blocks each receiving a second address portion of the same address different from the first address signal group. Each of the decoder blocks includes a selecting unit receiving the second address signal group for outputting an active first word selection control signal when the decoder block is designated by the second address signal group, and a pair of word selecting units receiving the first word selection control signal and a third address signal group of the same address different from the first and second address signal groups, for generating a pair of second complementary word selection control signals and another pair of third complementary word selection control signals. Each decoder block also includes a plurality of decoding units each including a series-circuit constituted of first, second, third and fourth series-connected transistors, having their control electrode connected to receive the second and third complementary word selection control signals, respectively. Opposite ends of the series-circuit are connected to receive a corresponding one of the word selection driving signals. A connection node between the first and second transistors generates a first word selecting signal, and a connection node between the third and fourth transistors generates a second word selecting signal. Only one of the word selecting signal is activated at a time.

6 Claims, 8 Drawing Sheets

DECODING CIRCUIT FOR USE IN SEMICONDUCTOR READ ONLY MEMORY

BACKGROUND OF THE INVENTION

1. Field of the Invention

The present invention relates to a decoding circuit, and more specifically a decoding circuit for use in a semiconductor read only memory.

2. Description of Related Art

Referring to FIGS. 1A and 1B, which are an equivalent circuit and a partial layout pattern of a conventional semiconductor read only memory, it has an NAND type cell structure in which "n" memory cells are connected in series in a column direction. According to one typical programming method, data is written by means of an ion implantation to selectively form depletion transistors "Dji" indicative of data "0" and enhancement transistors "Ejn" representative of data "1".

Now, assuming that the data has been written in the above mentioned programming manner, a method for reading data will be described.

A gate of a memory cell to be selected is brought to a low level by one of outputs X1 to Xn of a word selecting circuit, and on the other hand, a gate voltage of memory cells not to be selected is brought to a high level by the others outputs of the word selecting circuit. Assuming that the memory cell to be selected is the enhancement transistors "Ejn", since the gate voltage of the transistor of the memory cell to be selected is at the low level, the memory cell transistor to be selected is in an OFF condition, and therefore, no current flows through an NAND type cell column Yj composed of the series-connected "n" memory cells including the memory cell to be selected. On the other hand, assuming that the memory cell to be selected is the depletion transistors "Dji", since the gate voltage of the transistor of the memory cell to be selected is at the low level, the memory cell transistor to be selected is in an ON condition, and therefore, a current flows through the NAND type cell column Yj composed of the series-connected "n" memory cells including the memory cell to be selected. Therefore, by sensing this current, it is possible to read out the written data.

With a demand for a large scaling, the memory cells are being microminiaturized, and the gate oxide film are correspondingly being thinned. Therefore, since non-selected word lines have to be brought at the high level in a standby condition and in a normal reading condition, a a gate oxide film destruction has often occurred so that it becomes impossible to read the data from the memory cell, or a leakage current in the standby condition has increased.

Under this circumstance, Japanese Patent Application Laid-open Publication Heisei 4-095298 has proposed a decoding circuit so configured that a group of NAND type cells including a memory cell to be selected is divided into a plurality of cell blocks, and all non-selected word lines of one cell block including the memory cell to be selected are brought to the high level, but the words lines of the other cell blocks are maintained at a low level. In this proposed decoding circuit, however, when the selected block and the non-selected block are switched into a non-selected condition and in a selected condition, respectively, a parasitic capacitance of the word lines (gate capacitance of the memory cells) is charged or discharged at a time, so that noise occurs in power supply lines due to a charge current for charging the parasitic capacitance, and also, noise occurs in ground lines due to a discharge current for discharging the parasitic capacitance. These noises deteriorates characteristics of the decoding circuit itself, and gives an adverse influence on other circuits such as sense amplifiers through the power supply lines and the ground lines, with the result that the reading speed is deteriorated.

In order to overcome this defect, Japanese Patent Application Laid-open Publication Heisei 5-347094 (the disclosure of which is incorporated by reference in its entirety into the present application) has proposed another decoding circuit, which is shown in FIG. 2. In the shown decoding circuit, a word line driving circuit is composed of a predecoding unit 18 and a plurality of decoder blocks 191, 192, . . . , 19j which are provided in accordance with the number of memory cells and each of which includes a selecting unit 16 and a plurality of decoding units 171, 172, . . . , 17n provided for word lines X11, X12, . . . , X1n, respectively.

The predecoding unit 18 is configured to decode an external address signals A, B, C and D for generating signals XP1T to XPnT and XP1B to XPnB.

In the decoder block 191, the decoding unit 171 includes a P-channel MOS transistor (called a "PMOS transistor" hereinafter) P11, and a pair of N-channel MOS transistors (called a "NMOS transistor" hereinafter) N11 and N12 having their drain connected in common to a drain of the PMOS transistor P11 and their source connected to ground, the common-connected drains of the PMOS transistors P11 and the NMOS transistors N11 and N12 constituting an output node connected to the word line X11, and a gate of the NMOS transistors N11 and N12 being connected to receive a signal S1 outputted from the selecting unit 16.

The decoding units 171 to 17n have the same circuit construction, and the PMOS transistor P11 corresponds to PMOS transistors P21 to Pn1, and the NMOS transistor N11 corresponds to NMOS transistors N21 to Nn1. In addition, the NMOS transistor N12 corresponds to NMOS transistors N22 to Nn2, and the output node (word line) X11 corresponds to output nodes (word lines) X12 to X1n. Further explanation of the decoding units 171 to 17n will be omitted for simplification of the description.

Sources of the PMOS transistors P11 to Pn1 are connected to receive the signals signals XP1B to XPnB generated by the predecoding unit 18, respectively. Gates of the NMOS transistors are connected to receive the signals signals XP1T to XPnT generated by the predecoding unit 18, respectively.

Furthermore, the decoder blocks 191 to 19n have the same circuit construction, and therefore, explanation of the internal structure of the decoder blocks 192 to 19n will be omitted for simplification of the description. Selection signals E, F and G are supplied to the selecting unit 16 of each of the decoder blocks 191 to 19n. The output signals (word lines) X11 to X1n correspond to output signals (word lines) X21 to X2n of the decoder blocks 192, . . . , output signals Xj1 to Xjn of the decoder blocks 19j.

Here, it is assumed that, when the output signals XP2T and XP2B of the predecoding unit 18 are activated in response to the external address signal A, B, C and D, the output signal XP2T is brought to a high level, and the output signals XP2B is brought to a low Level. All of the other output signals XP1T, XP3T to XPnT are brought to the low level, and all of the other output signals XP1B, XP3B to XPnB are brought to the high level. In addition, in response to the external address signal E, F and G, the selecting unit 16 generates the active signal S1 of the low level.

In this situation, in the decoding unit 171, the PMOS transistor P11 and the NMOS transistor N12 receiving the output signal XP2T at its gate are turned on the word line X11 is pulled down to the low level.

In the other decoding units 172, 173, . . . , 17n, the corresponding NMOS transistors N22, N32, . . . , Nn2 are off, the corresponding transistors P21, P31, . . . , Pn1 are on. Accordingly, the word lines X12, X13, . . . , X1n are supplied with the high level from the corresponding outputs of the predecoding units 18, and therefore, are pulled up to the high level.

Thereafter, if the decoder block 191 becomes non-selected in response to the external address signal E, F and G, the selecting unit 16 generates the inactive signal S1 of the high level, which are supplied to the gate of the transistors P1 and N11, P21 and N21, . . . , Pn1 and Nn1, so that the PMOS transistors P11 to Pn1 are rendered off and the NMOS transistors N11 to Nn1 are rendered on. Accordingly, all the word lines X11 to X1n are pulled down to the low level. At this time, the circuit is so configured that the block select NMOS transistors N11 to Nn1 have a driving capability smaller than that of the transistors N12 to Nn2, so that the discharge speed is low.

As seen from the above, the conventional decoding circuit is such that the power supply potential of the decoding units is supplied from the predecoding unit so that the power supply noise is reduced by the on-resistance of the transistors in the predecoding unit, and in addition, the block select transistors are provided so as to lower the discharge speed so that the ground noise is also reduced.

Referring to FIG. 3, there is shown a layout pattern illustrating a portion of the decoding unit in the conventional decoding circuit. In the shown layout pattern, hatched elongated regions designate an aluminum wiring conductor, and pear-skin regions designate a polysilicon wiring conductor. In addition, rectangular regions surrounded by a thick solid line designate a diffused layer, and a rectangular region surrounded by a dotted line designates an N-well. Black squares show a contact hole.

In the shown layout pattern, thus, the polysilicon crossing the diffused layer constitutes a gate electrode, and a portion of the diffused layer at one side of this polysilicon forms a drain region, and a portion of the diffused layer at the other side of this polysilicon forms a source region. Accordingly, the NMOS transistors N11 and N12 and N21 and N22 are formed, and in addition, the PMOS transistors P11 and P21 are formed in the N-well. Thus, the decoding units 171 and 172 are constituted.

Here, it is also assumed that the circuit is designed on the basis of such a rule that the aluminum wiring conductor having a width of 1 μm and the spacing between adjacent aluminum wiring conductors is 1 μm. In addition, the transistor is so sized as to have a channel width of 6 μm and a channel length of 1 μm. In this case, a block including the decoding circuits 171 and 172 has a width X of 17 μm and a length Y of 41 μm.

Recently, there is a large demand for increasing a memory capacity and a reading speed in this type semiconductor memory, and also such memories are desired to be inexpensively available. In particular, in speeding up the semiconductor memory, the delay in the charge/discharge of the word lines, namely, the delay of the word selection signal, is a problem. In this connection, it might be considered to suppress the delay of the word selection signal by use of a multilayer wiring technique. However, this is expensive and results in an increased number of manufacturing steps. Accordingly, a product cost increases, and delivery of finished products is delayed.

If the multilayer wiring technique is not used, the wiring length becomes long. Therefore, in order to realized a high speed operation by solving the delay of the word selection signal, it is necessary to provide a plurality of word line driving circuits so as to reduce the parasitic capacitance and a parasitic resistance distributed on the word selection signal lines. However, if a plurality of word line driving circuits are provided, the area occupied by the word line driving circuits increases, in particular in the X direction.

Here, referring to the layout pattern of FIG. 3, in order to realize the conventional decoding unit, at least one ground aluminum wiring conductor and four aluminum wiring conductors for the signals from the predecoding unit are required. Assuming that the length of a memory cell block is equal to Y (41 μm in the shown example), in order to locate the decoding units so that "n" signal lines corresponding to all the word selection signals are arranged within the range of this length Y, the decoding units have to be located continuously in the X direction.

Therefore, according to the layout pattern shown in FIG. 3, the two decoding units take 17 μm in the X direction, and therefore, in order to realize the decoder block 191 shown in FIG. 2, the required size in the X direction becomes 17 μm×n/2.

In the conventional product, the rate "Xs" in area of a unitary word driving circuit to the whole of a chip is about 10%. Accordingly, if the number "p" of unitary word driving circuits provided is 4, since the total area of all the unitary word driving circuits increases with the proportion of Xs×p= Xs×4=40%, the whole area of each chip becomes 1.4 times.

Accordingly, since the conventional decoding circuit as mentioned above has a large number of signal wiring conductors extending from the predecoding unit, the required chip area greatly depends upon the numbers of the aluminum wiring conductors used as the signal wirings. As a result, the chip area has inevitably increased.

SUMMARY OF THE INVENTION

Accordingly, it is an object of the present invention to provide a decoding circuit for use in a semiconductor read only memory, which has overcome the above mentioned defect of the conventional one.

Another object of the present invention is to provide a decoding circuit for use in a semiconductor read only memory, having a decoding unit of a reduced area in the layout pattern, resulting in a reduced area of a chip size.

The above and other objects of the present invention are achieved in accordance with the present invention by a decoding circuit for use in a semiconductor read only memory comprising:

a predecoding unit receiving a first address signal group of a given address, for activating only one of a plurality of word selection driving signals; and a plurality of decoder blocks each including:
   a selecting means receiving receiving a second address signal group of the given address different from the first address signal group, and having an output for outputting an active first word selection control signal when a corresponding decoder block is designated by the second address signal group;
   a word selecting means receiving the first word selection control signal and a third address signal group of the given address different from the first and second address signal groups, for generating second, third, fourth and fifth word selection control signals, the second and third word selection control signals being complementary to each other, the fourth and fifth word selection control signals being complementary to each other, the second and fifth word selection control signals being complementary each other when the first word selection control signal is active but having the same logical condition when the first word selection control signal is inactive;

a plurality of decoding means each including a first series-circuit constituted of series-connected first, second, third and fourth transistors, which have their control electrode connected to receive the second, third, fourth and fifth word selection control signals, respectively, opposite ends of the first series-circuit being connected to receive a corresponding one of the word selection driving signals as a power supply source, a connection node between the second and third transistors being connected to a selected one of the output of the selecting means and ground as another power supply source, a connection node between the first and second transistors generating a first word selecting signal, and a connection node between the third and fourth transistors generating a second word selecting signal, whereby only one of the word selecting signals is activated at a time.

In one embodiment, the first, second, third and fourth transistors first, second, third and fourth NMOS transistors, respectively.

In one modification, each of the decoding means further includes a second series-circuit constituted of series-connected first, second, third and fourth PMOS transistors, which have their gate electrode connected to receive the third, second, fifth and fourth word selection control signals, respectively, opposite ends of the second series-circuit being connected to receive the corresponding one of the word selection driving signals as a power supply source, a connection node between the second and third PMOS transistors being connected to the connection node between the second and third NMOS transistors, a connection node between the first and second PMOS transistors being connected to the connection node between the first and second NMOS transistors, and a connection node between the third and fourth PMOS transistors being connected to the connection node between the third and fourth NMOS transistors.

In another modification, the connection node between the first and second transistors is connected to an input of a first inverter, which generates at its output the first word selecting signal, and the connection node between the third and fourth transistors is connected to an input of a second inverter, which generates at its output the second word selecting signal.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
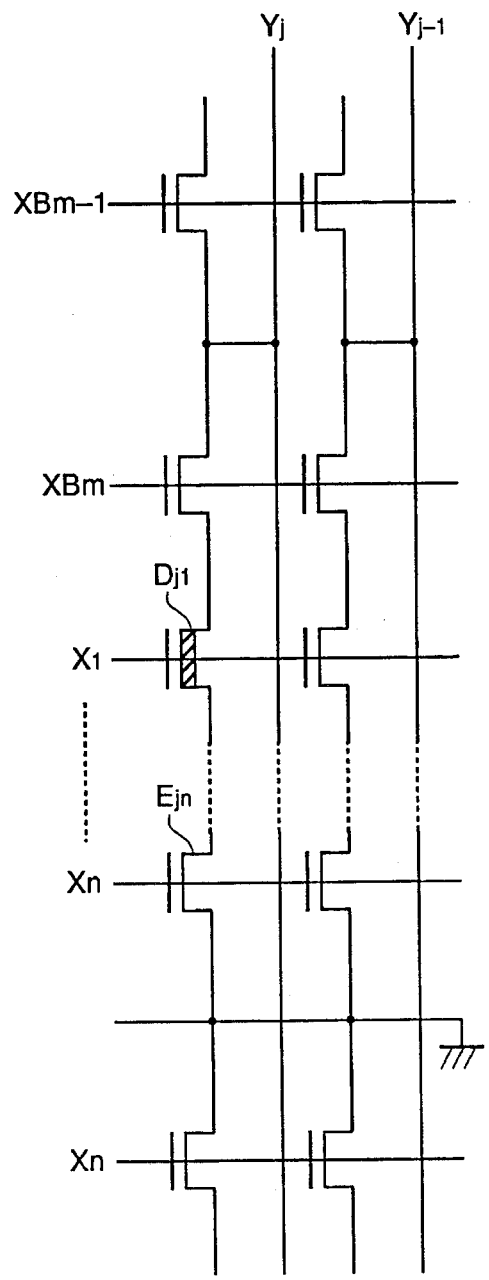
FIG. 1A is an equivalent circuit diagram of a conventional semiconductor read only memory.
Figure 1B:
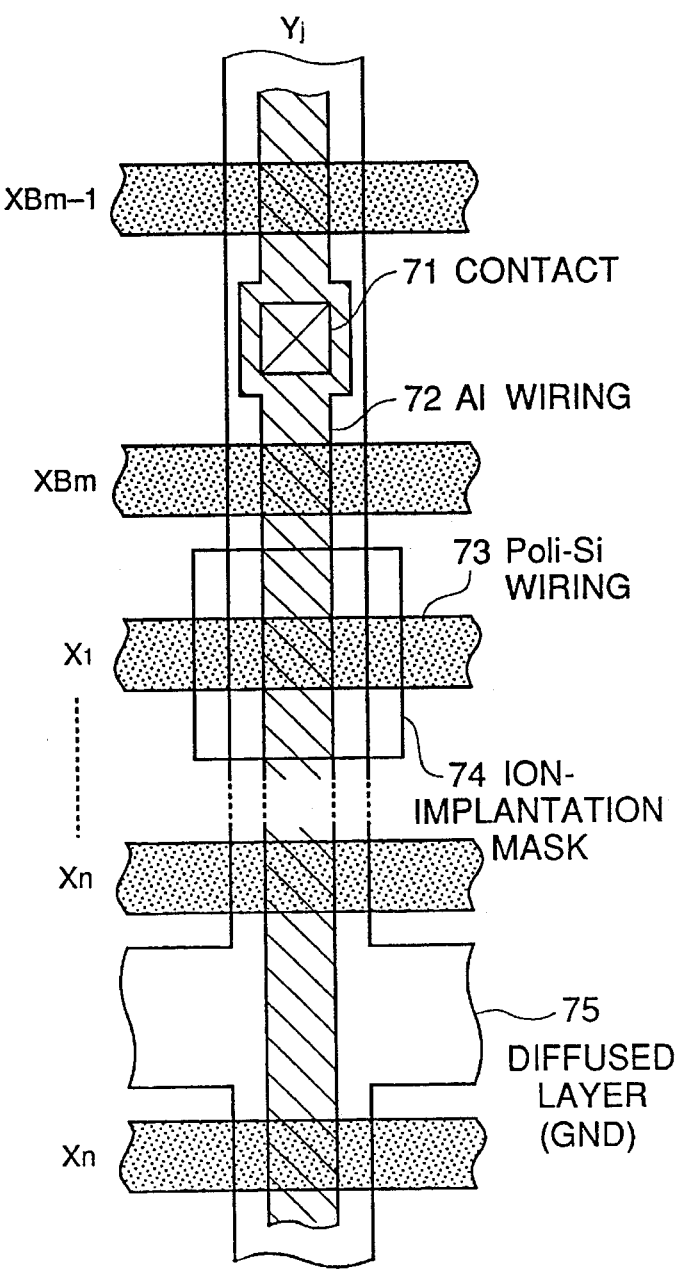
FIG. 1B is a partial layout pattern of the conventional semiconductor read only memory shown in FIG. 1 A.
Figure 2:
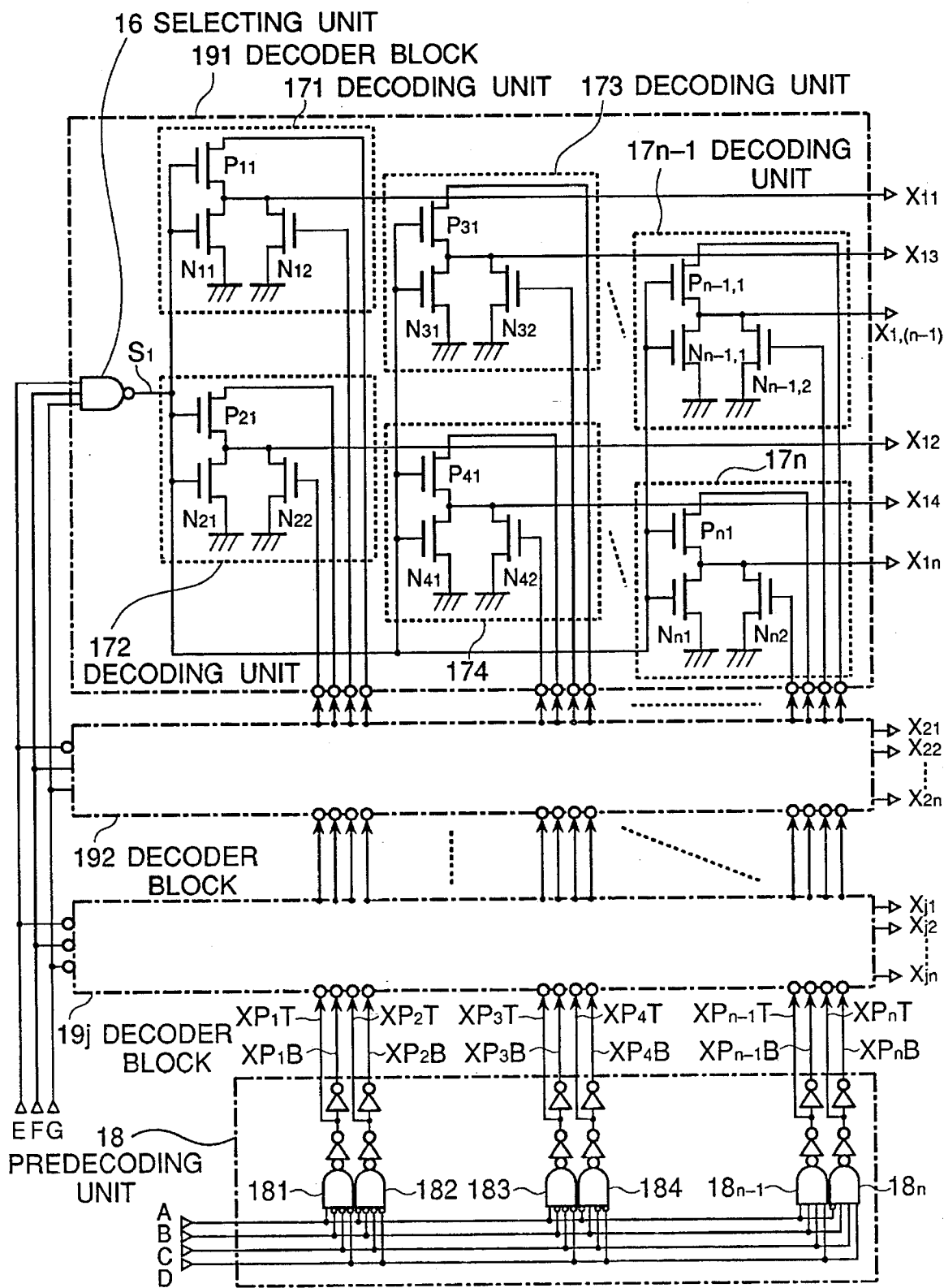
FIG. 2 is a circuit diagram of a conventional decoding circuit for use in the semiconductor read only memory.
Figure 3:
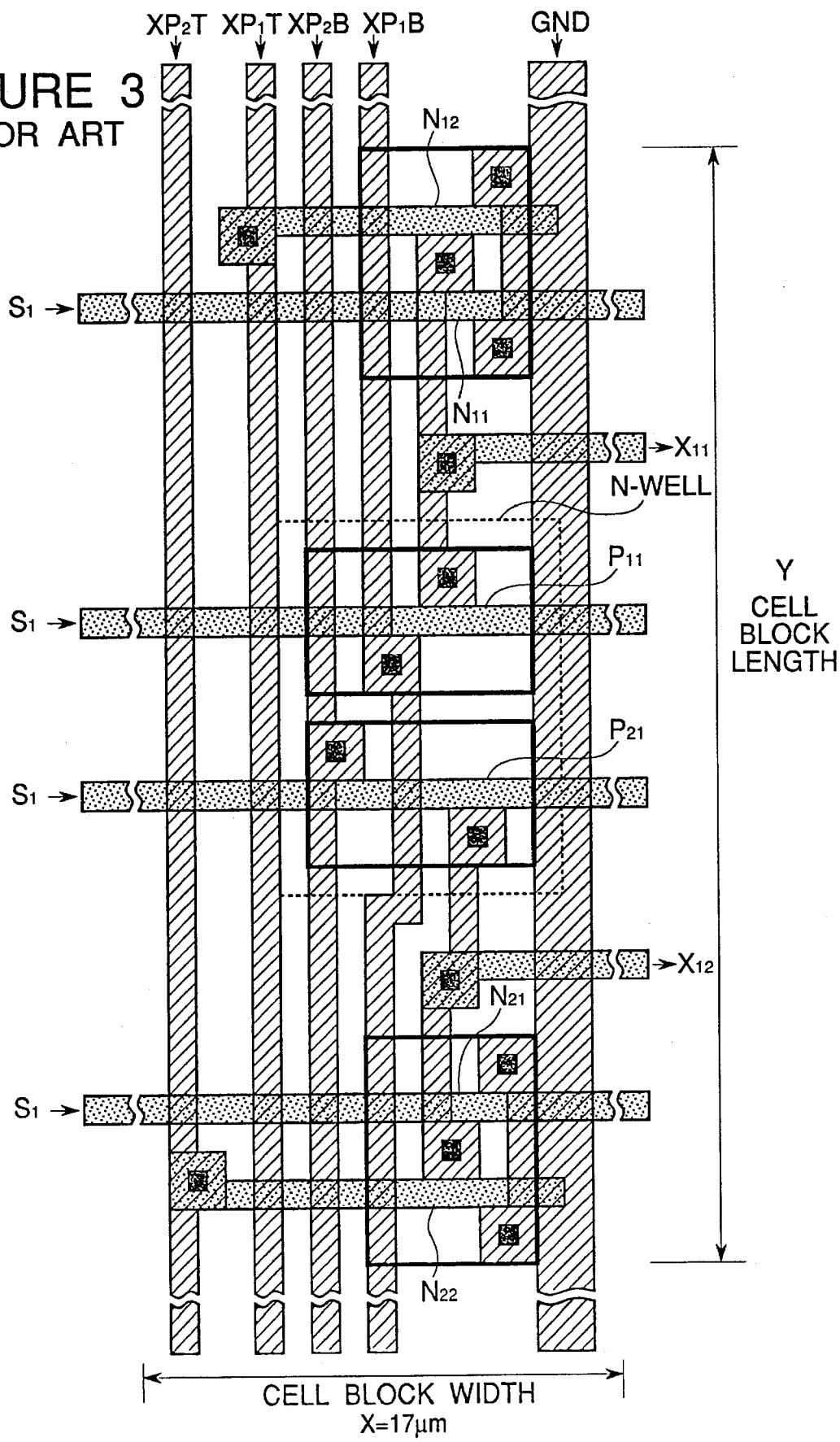
FIG. 3 is a layout pattern of a portion of the conventional decoding circuit shown in FIG. 2.
Figure 4:
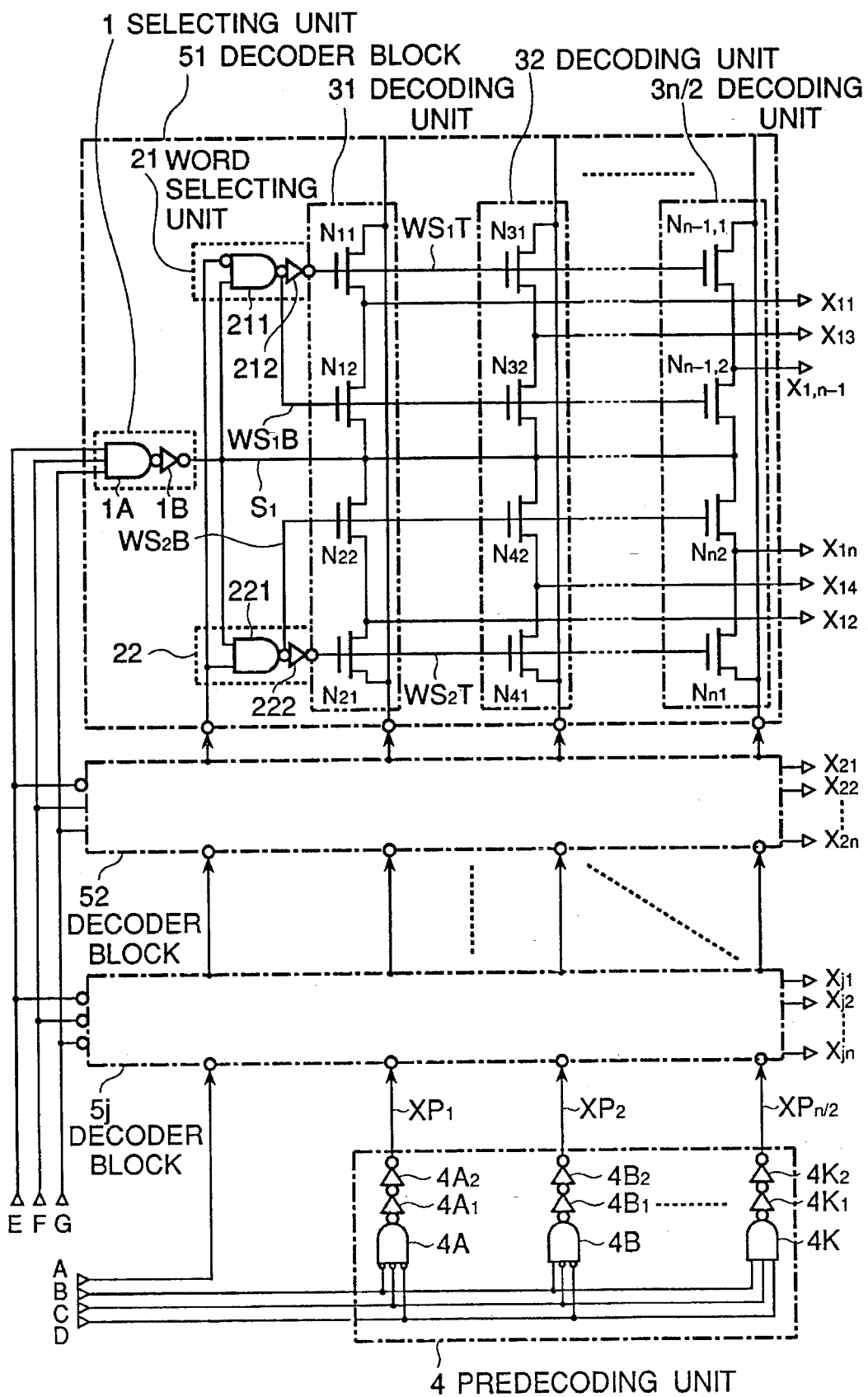
FIG. 4 is a block diagram of a first embodiment of the decoding circuit in accordance with the present invention for use in the semiconductor read only memory.

Referring to FIG. 4, there is shown a block diagram illustrating an overall structure of a first embodiment of the decoding circuit in accordance with the present invention.

The shown decoding circuit includes a predecoding unit 4 taking a negative active logic, and a plurality of decoder blocks 51, 52, ..., 5j. These decoder blocks 51, 52, ..., 5j have the same circuit construction, but the decoder block 51 generates "n" word selecting signals X11, X12, ..., X1n for a corresponding number of word lines. The decoder block 52 generates "n" word selecting signals X21 X22, ..., X2n for a corresponding number of word lines, and similarly, the decoder block 5j generates "n" word selecting signals Xj1, Xj2, ..., Xjn for a corresponding number of word lines.

As mentioned above, since the decoder blocks 51, 52, ..., 5j have the same circuit construction, only an internal structure of the decoder block 51 will be described. The decoder block 51 includes a decoding unit 1, which composed of a 3-input NAND gate 1A receiving three bits E, F and G of an external address signal (external decode signal), and an inverter 1B having its input connected to an output of the NAND gate 1A and its output for generating a first word selecting signal S1. The decoder block 51 includes a pair of word selecting units 21 and 22. The word selecting unit 21 includes a 2-input NAND gate 211 having its inverting first input receiving one bit A of the external address signal (external decode signal) and its non-inverting second input receiving the first word selection control signal S1, and its output for generating an inverted word selection control signal WS1B, and an inverter 212 having its input connected to the output of the NAND gate 211 and its output for generating a non-inverted word selection control signal WS1T. The word selecting unit 22 includes a 2-input NAND gate 221 having its non-inverting first input receiving the one bit A of the external address signal and its non-inverting second input receiving the first word selection control signal S1, and its output for generating an inverted word selection control signal WS2B, and an inverter 222 having its input connected to an output of the NAND gate 221 and its output for generating an inverted signal WS2T.

Furthermore, the decoder block 51 includes a plurality of decoding units 31, 32, ..., 3n/2, the number of these decoding units being determined in accordance with the number of word selecting signals X11 to X1n required for each one memory cell block. The decoding units 31, 32, ..., 3n/2 have the same circuit construction. For example, the decoding unit 31 includes two pairs of NMOS transistors N11 and N12 and N21 and N22.

More specifically, the predecoding unit 4 is configured to receive and decode three bits B, C and D of the external address signal in order to selectively activate only one of word selection driving signals XP1 to XPn/2 at one time. For example, the word selection driving signals XP1 is generated by a circuit composed of a 3-input NAND gate 4A receiving the three bits B, C and D at its inverting first to three inputs, respectively, and two cascaded inverters 4A1 and 4A2 receiving an output of the NAND gate 4A. The word selection driving signals XP2 is generated by a circuit composed of a 3-input NAND gate 4B receiving the three bits B, C and D at its non-inverting first input and its inverting second and three inputs, respectively, and two cascaded inverters 4B1 and 4B2 receiving an output of the NAND gate 4B. The word selection driving signals XPn/2 is generated by a circuit composed of a 3-input NAND gate 4K receiving the three bits B, C and D at its non-inverting first to three inputs, respectively, and two cascaded inverters 4K1 and 4K2 receiving an output of the NAND gate 4K.

As seen from the above, the predecoding unit 4 does not generate the second word selecting control signals XP1B to XPnB which were generated in the predecoding unit 18 of the conventional example.

In the decoding unit 31, the NMOS transistors N11, N12, N22 and N21 are connected in series in the named order. A drain (or a source) of the NMOS transistors N11 and N21, which constitute a pair of opposite ends of a series circuit composed of the NMOS transistors N11, N12, N22 and N21, are connected to a signal line of the word selection driving signals XP1. A gate of the NMOS transistor N11 is connected to receive the word selection control signal WS1T, and a gate of the NMOS transistor N12 is connected to receive the word selection control signal WS1B. A gate of the NMOS transistor N22 is connected to receive the word selection control signal WS2B, and a gate of the NMOS transistor N21 is connected to receive the word selection control signal WS2T. A connection node between the NMOS transistors N12 and N22 is connected to a signal line of the first word selection control signal S1. A connection node between the NMOS transistors N11 and N12 is connected to a signal line of the word selecting signal X11, and a connection node between the NMOS transistors N21 and N22 is connected to a signal line of the word selecting signal X12.

As mentioned above, the decoding units 32 to 3n/2 have the same construction as that of the decoding unit 31. The transistor N11 corresponds to transistors N31 to N(n–1),1, and the transistor N12 corresponds to transistors N32 to N(n–1),2. The transistor N21 corresponds to transistors N41 to Nn1, and the transistor N22 corresponds to transistors N42 to Nn2. In addition, the word selecting signal X11 corresponds to the word selecting signals X13 to X1,(n–1), and the word selecting signal X12 corresponds to the word selecting signals X14 to X1n. Furthermore, the word selection driving signals XP2 to XPn/2 are applied to the transistors N31 to N(n–1),1, respectively, and also applied to the transistors N41 to Nn1, respectively.

In addition, the decoder blocks 51 to 5J have the same construction. On the other hand, since the three bits E, F and G of the external address signal (external decode signal), eight different combinations can be obtained from the three bits. Accordingly, one of the eight different combinations is assigned to one of the decoder blocks 51 to 5J. Namely, in this case, J=8. Therefore, the selecting unit 1 of each of the decoder blocks 51 to 5J is configured to generate an active word selecting signal when it receives an assigned combination of the three bits.

Referring to FIG. 4 again, the number of the word selecting signals X11 to X1n required for one memory block is determined by the number "K" of the bits A, B, C and D of the external address signal. Namely, n=2$^K$. Now, assuming that the bit A is the least significant bit, the predecoding unit 4 outputs the word selection driving signals XP1 to XPn/2 of the number which is a half of the number "n" of the required word selecting signals X11 to X1n.

On the other hand, the least significant address bit A is supplied to the word selecting units 21 and 22 receiving at its one input the word selection control signal S1 from the selecting unit 1, and the word selecting units 21 and 22 generate the word selection control signal WS1T and its inverted signal WS1T, and the word selection control signal WS2T and its inverted signal WS2T, respectively. The word selection control signal WS1T is supplied in common to the gate of the NMOS transistors N11, N31, . . . , N(n–1),1, which receive at their drain the word selection driving signals XP1 to XPn/2, respectively. The inverted word selection control signal WS1B is supplied in common to the gate of the NMOS transistors N12, N32, . . . , N(n–1),2, which receive at their source the word selection control signal S1 in common. Thus, the word selecting signal X11, X13, . . . , X1,(n–1) are outputted from the drain of the NMOS transistors N12, N32, . . . , N(n–1),2 to an external, respectively. Similarly, the word selecting signals X12, X14, . . . , X1n are outputted by the NMOS transistors N21 and N22, N41 and N42, . . . , Nn1 and Nn2 to an external, respectively.

Now, it is assumed that the decoder block 51 is selected or activated by the external address signals E, F and G, and the word selection control signal S1 is brought to the high level. It is also assumed that, the predecoding unit 4, which receives the most significant bits B, C and D of the external address signals for selecting one of the word selecting signals X11, X12, . . . , X1n, activates the word selection driving signal XP1 to the low level and deactivates all of the word selection driving signals XP2 to XPn/2 to the high level.

At this time, if the least significant bit A of the external address signals for selecting one of the word selecting signals X11, X12, . . . , X1n is at the low level, the word selecting unit 21 is activated to bring its non-inverted word selection control signal WS1T and its inverted word selection control signal WS1B to the high level and the low level, respectively. In this condition, the transistor N11 is on and the transistor N12 is off, so that the word selecting signal X11 is pulled down to the low level by the word selection driving signal XP1 through the transistor N11. On the other hand, the transistors N31, . . . , N(n–1),1 receiving at their gate the non-inverted word selection control signal WS1T are on, so that the corresponding word selecting signals X13, . . . , X1,(n–1) are pulled up to the high level by the corresponding word selection driving signals XP2, . . . , XPn/2 through the turned-on transistors N31, . . . , N(n–1),1.

At this time, on the other hand, the word selecting unit 22 is deactivated, and therefore, the word selection control signal WS2T is brought to the low level and the word selection control signal WS2B is brought to the high level. Accordingly, the transistor N21 is off and the transistor N22 is on. Thus, the word selecting signal X12 is pulled up to the high level by the selection control signal S1 of the selecting unit 1 through the turned-on transistors N22. Similarly, the word selecting signals X14, ..., X1n are pulled up to the high level through the turned-on transistors N42, ..., Nn2.

Then, if the least significant bit A is brought to the high level, the word selecting unit 21 is deactivated and the word selecting unit 22 is activated. Accordingly, the word selection control signal WS2T is brought to the high level and the word selection control signal WS2B is brought to the low level. In addition, the word selection control signal WS1T is brought to the low level and the word selection control signal WS1B is brought to the high level. Accordingly, the transistor N11 is off and the transistor N12 is off, and the transistor N21 is on and the transistor N22 is off, Thus, the word selecting signal X11 is pulled up to the high level by the selection control signal S1 of the selecting unit 1 through the turned-on transistors N12, and the word selecting signal X12 is pulled down to the low level by the word selection driving signal XP1 through the turned-on transistors N21.

As seen from the above, only one of the word selecting signals X11, ..., X1n is brought to the low level, and the other word selecting signals are brought to the high level.

If the decoder block 51 is deactivated in accordance with the external address signals E, F and G, the selection control signal S1 of the selecting unit 1 is brought the low level, and both the word selecting units 21 and 22 are deactivated regardless of the least significant address signal A, so that word selection control signals WS1T and WS2T are brought to the low level and the word selection control signals WS1B and WS2B are brought to the high level.

Accordingly, the transistors N11, N21, N31, N41, ..., Nn1 are off and the transistors N12, N22, N32, N42, ..., Nn2 are on. Therefore, regardless of the word selection driving signals XP1, XP2, ..., XPn/2 from the predecoding unit 4, all the word selecting signals X11, ..., X1n are brought to the low level by the selection control signal S1 of the selecting unit 1 through the turned-on transistors N12, N22, N32, N42, ..., Nn2. Therefore, an operation similar to that of the conventional example can be obtained.

Figure 5:
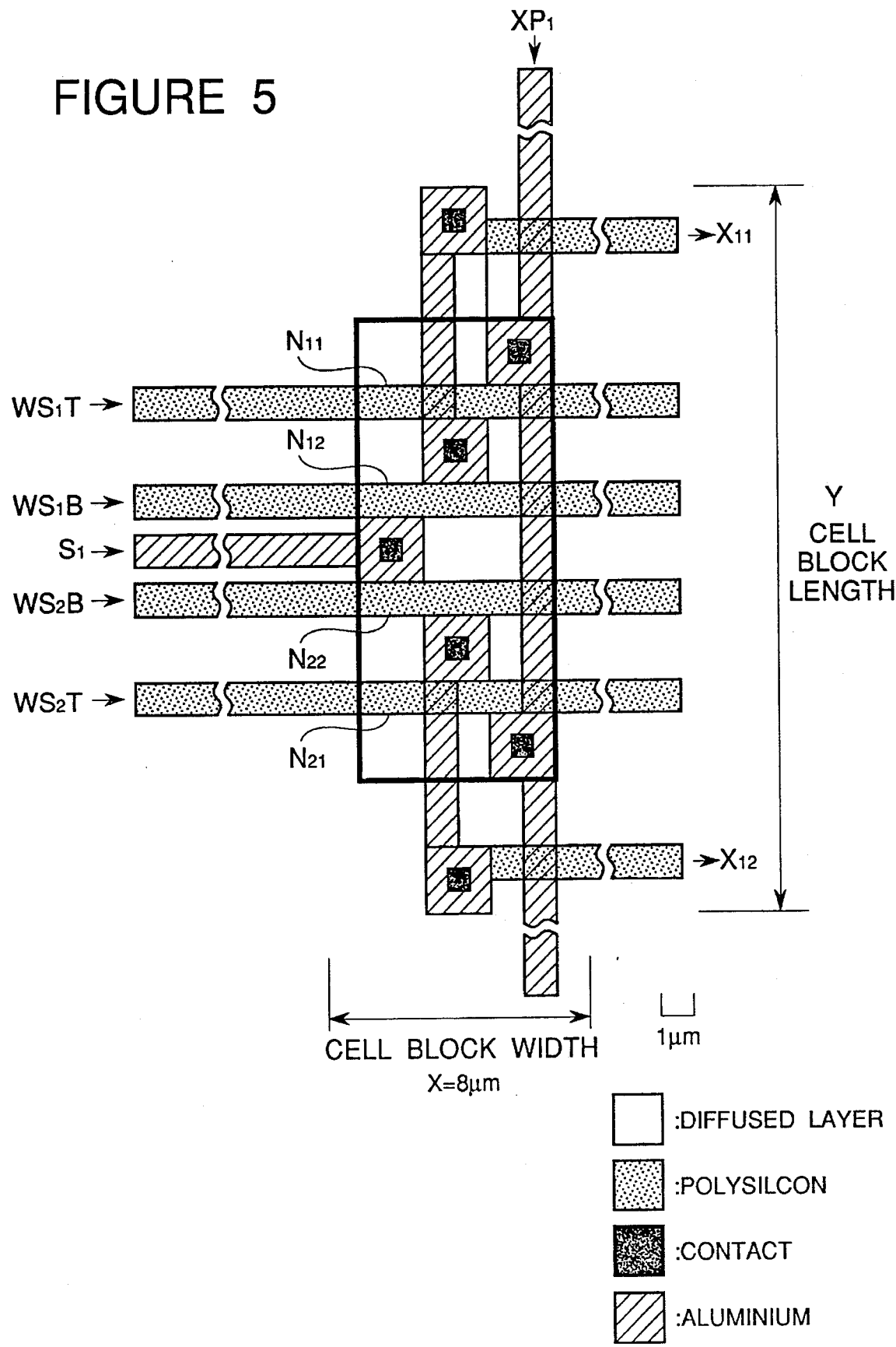
FIG. 5 is a layout pattern of a portion of the decoding circuit shown in FIG. 4.

Referring to FIG. 5, there is shown a layout patten of only the decoding unit 31 of the first embodiment of the decoding circuit shown in FIG. 4.

Here, it is also assumed that the circuit is designed on the basis of such a rule that the aluminum wiring conductor having a width of 1 μm and the spacing between adjacent aluminum wiring conductors is 1 μm. In addition, the transistor is so sized as to have a channel width of 6 μm and a channel length of 1 μm. In this case, a block including the decoding circuits 171 and 172 has a width X of 17 μm and a length Y of 41 μm.

Comparing this embodiment with the conventional example, in the case of realizing the two word selecting lines X11 and X12, since the number of aluminum wiring conductors for the signals supplied from the predecoding unit 4 is reduced to only one from four which were required in the conventional example, the width of only the decoding unit 31 is made 8 μm. On the other hand, the length of the memory cell block in the Y direction does not change. Therefore, when the decoding units required for supplying all the word selecting signals are located continuously in the X direction in FIG. 5, the necessary size can be reduced to 47% in the X direction.

Further comparing with the conventional example, if "p" unitary word driving circuits are provided, the required chip area can be reduced at the rate of about 0.5×Xs×p. In case of p=4, the whole area of the chip which was 1.4 times in the conventional example can be reduced to 0.8. In other words, the whole area of the chip can be reduced to about 60% of the conventional example.

Figure 6:
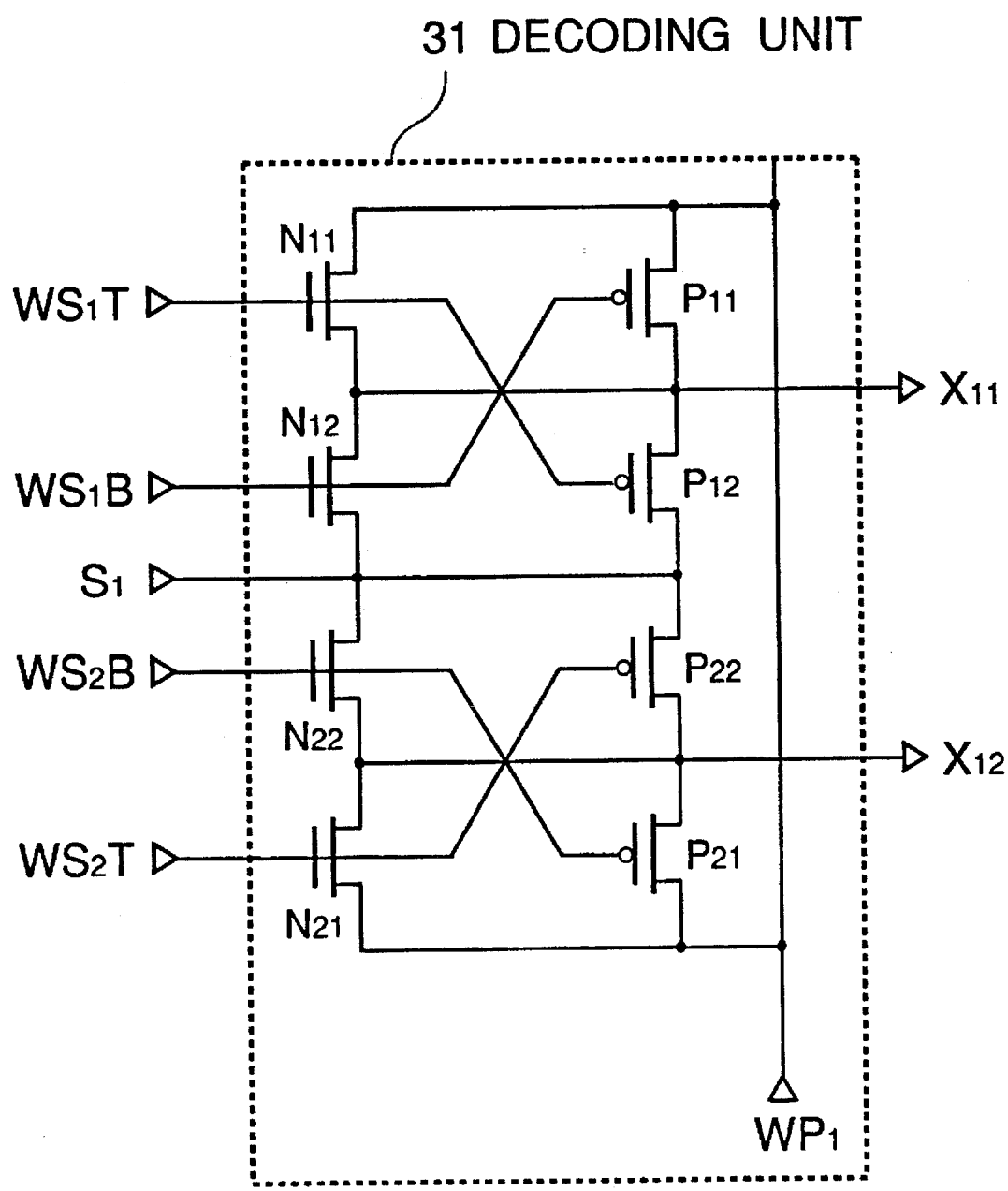
FIG. 6 is a circuit diagram illustrating an essential part of a second embodiment of the decoding circuit in accordance with the present invention for use in the semiconductor read only memory.

Referring to FIG. 6, there is shown a circuit diagram illustrating the decoding unit 31 of a second embodiment of the decoding circuit in accordance with the present invention.

The second embodiment is different from the first embodiment only in that each decoding unit is constituted of complementary MOS transistors. For simplification of description, only the decoding circuit 31 illustrated in FIG. 6. The decoding circuit 31 illustrated in FIG. 6 includes, in addition to the series circuit formed of the four series-connected NMOS transistors N11, N12, N21 and N22, another series circuit formed of four series-connected PMOS transistors P11, P12, P21 and P22. These two series circuit are connected in parallel to each other.

More specifically, the gate of the NMOS transistors N11 and a gate of the PMOS transistor P12 are connected to the output of the inverter 212 in the word selecting unit 21, and the gate of the NMOS transistors N12 and a gate of the PMOS transistor P11 are connected to the output of the NAND gate 211 in the word selecting unit 21. In addition, the gate of the NMOS transistors N22 and a gate of the PMOS transistor P21 are connected to the output of the inverter 222 in the word selecting unit 22, and the gate of the NMOS transistors N21 and a gate of the PMOS transistor P22 are connected to the output of the NAND gate 221 in the word selecting unit 22.

Furthermore, the series-connection node between the NMOS transistors N12 and N22, and a series-connection node between the PMOS transistors P12 and P22, are connected to the line for the word selection control signal S1. The series-connection node between the NMOS transistors N11 and N12, and a series-connection node between the PMOS transistors P11 and P12, are connected to the line for the word selecting signal X11, and the series-connection node between the NMOS transistors N22 and N21, and a series-connection node between the PMOS transistors P22 and P21, are connected to the line for the word selecting signal X12.

In the other points, the second embodiment is the same as the first embodiment and therefore, explanation will be omitted.

In this second embodiment, the source potentials of the PMOS transistors P11 and the NMOS transistors N11 are supplied from the word selection driving signals XP1 from the predecoding unit 4, and the drains of the PMOS transistors P11 and the NMOS transistors N11 supply the word selecting signal X11. In addition, the source potentials of the PMOS transistors P12 and the NMOS transistors N12 are supplied from the word selection control signal S1 from the selecting unit 1.

The gate of the NMOS transistor N11 is supplied with the word selection control signal WS1T from the word selecting unit 21, similarly to the first embodiment, and the gate of the PMOS transistor P11 is supplied with the word selection control signal WS1B complementary to word selection control signal WS1T. Furthermore, the gate of the NMOS transistor N12 is supplied with the word selection control signal WS1B from the word selecting unit 21, similarly to the first embodiment, and the gate of the PMOS transistor P12 is supplied with the word selection control signal WS1T complementary to the word selection control signal WS1B.

In this condition, when the word selection driving signal XP1 from the predecoding unit 4 is brought into a selecting condition, namely, to the low level, if the word selection control signal WS1T and the word selection control signal WS1B are brought to the high level and the low level, respectively, the transistors P11 and N11 are turned on, with the result that the word selecting signal X11 is pulled down to the low level by the word selection driving signal XP1 through transistors P11 and N11.

Alternatively, if the word selection control signal WS1T and the word selection control signal WS1B are brought to the low level and the high level, respectively, the transistors P12 and N12 are turned on, with the result that the word selecting signal X11 is pulled up to the high level by the word selection control signal S1 of the selecting unit 1 through transistors P12 and N12.

As seen from the above, it would be understood that the second embodiment operates similarly to the first embodiment.

Figure 7:
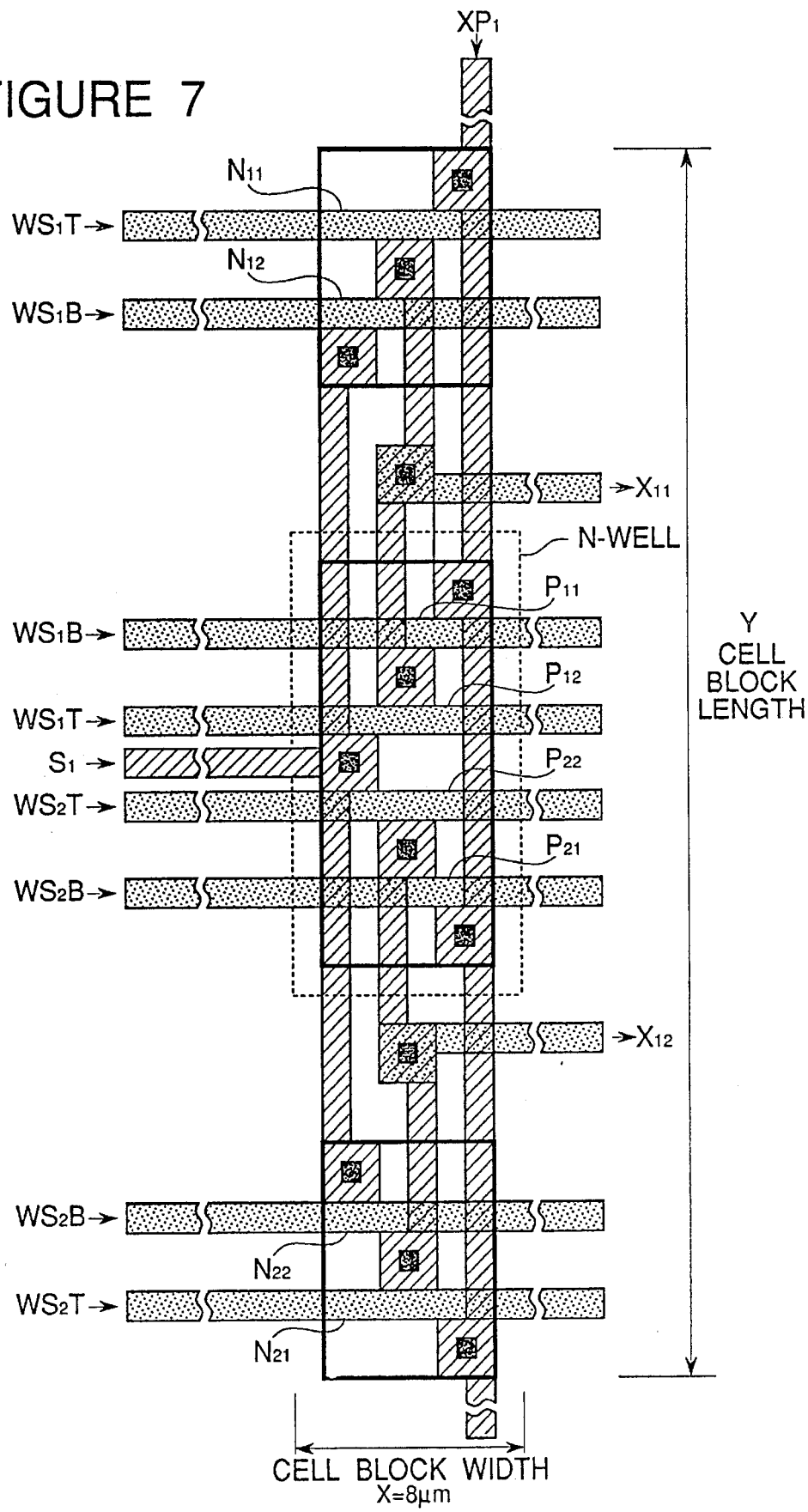
FIG. 7 is a layout pattern of a portion of the decoding circuit shown in FIG. 6.

Referring to FIG. 7 illustrating a layout patten of the decoding circuit 31 shown in FIG. 6, it would be understood that, although the size in the Y direction is increased by the additional PMOS transistors, the size in the X direction does not change.

Figure 8:
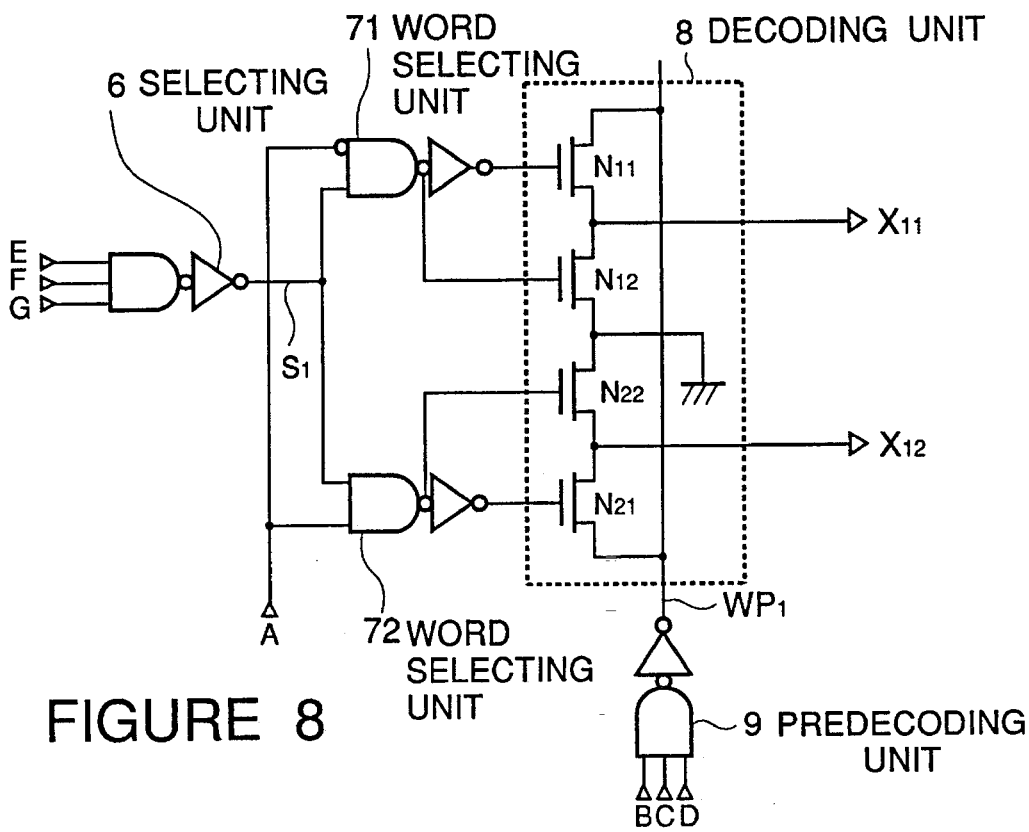
FIG. 8 is a circuit diagram illustrating an essential part of a third embodiment of the decoding circuit in accordance with the present invention for use in the semiconductor read only memory.

The above mentioned two embodiments have been so configured that only one of a plurality of word selecting signals is brought to the low level. Now, a third embodiment modified to the effect that only one of a plurality of word selecting signals can be brought to the high level, will be described with reference to FIG. 8, which is a circuit diagram illustrating only a part of a third embodiment of the decoding circuit in accordance with the present invention different from the first embodiment.

In the third embodiment, the sourced of the NMOS transistors N12 and N22 are connected to ground, not the word selection control signal S1 supplied from a selecting unit 6. In addition, a predecoding unit 9 is configured to take a positive active logic so that only a selected one (for example the word selection driving signal XP1) of the word selection driving signals is brought to the high level. Accordingly, for example, only the word selecting signal X11 is pulled up to the high level supplied from the predecoding unit 9 through the turned-on transistor N11.

Figure 9:
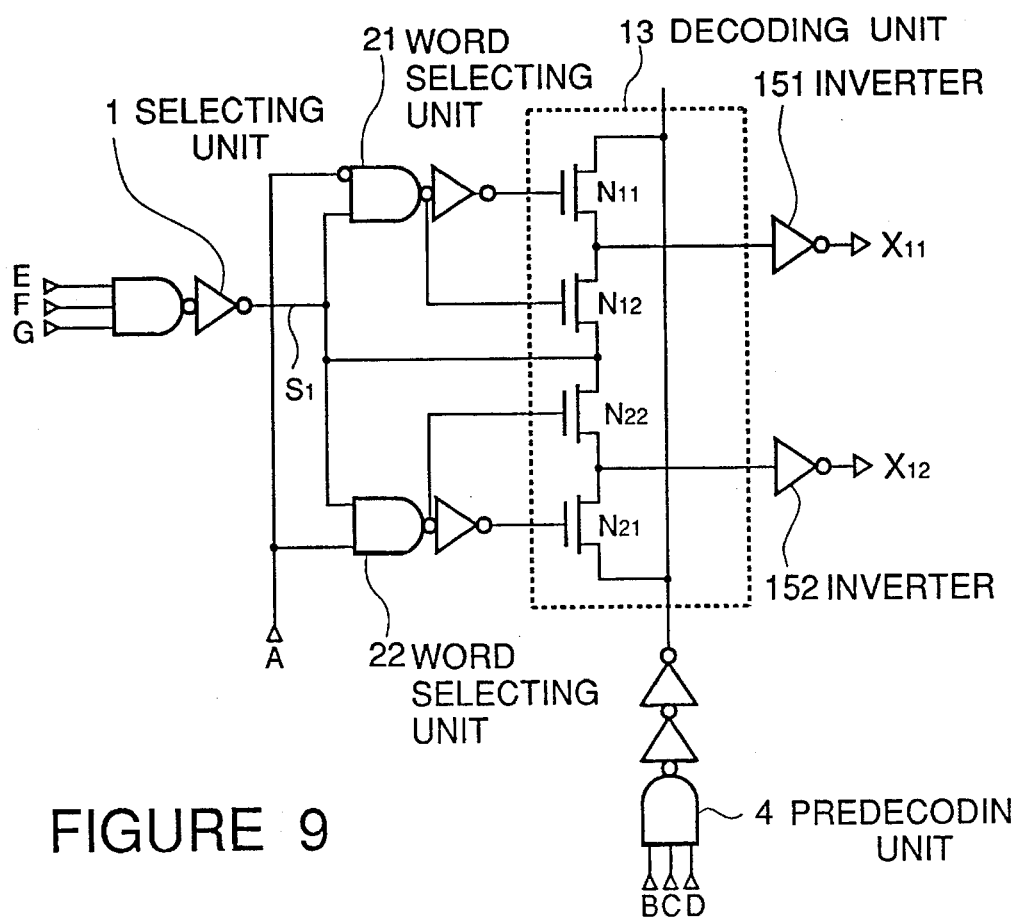
FIG. 9 is a circuit diagram similar to that of FIG. 8, but illustrating an essential part of a fourth embodiment of the decoding circuit in accordance with the present invention for use in the semiconductor read only memory.

Referring to FIG. 9, which is a circuit diagram illustrating an essential part of a fourth embodiment of the decoding circuit in accordance with the present invention different from the first embodiment, the fourth embodiment is characterized in that the connection node between the NMOS transistors N11 and N12 is connected to an input of an inverter 151 and the connection node between the NMOS transistors N21 and N22 is connected to an input of an inverter 152 so that the inverters 151 and 152 generates the word selecting signals X11 and X12 in the positive active logic. This is the only one difference between the first and fourth embodiments.

In the third and fourth embodiments, the constituents of the decoding unit are laid out as shown in FIG. 5, the size in the X direction of the decoding circuit is similar to that of the first embodiment.

As seen from the above, in the decoding circuit in accordance with the present invention requiring an address signal of "K" bits for selecting one word line from "n" word lines, each decoding unit is configured to receive at least one bit of the address signal as a selection control signal and also to receive, as a power supply voltage, a signal supplied from the selecting unit and a signal obtained by predecoding (K−1)bits of the address signal. With this arrangement, the number of the signal lines of the predecoding unit required for selecting one word line from "n" word fines, can be reduced to a half. Accordingly, the necessary area of the decoding circuit on the chip can be reduced to a half.

If it is assumed that "p" unitary word driving circuits, each composed of a plurality of decoding circuits, are provided on a single chip, the required chip area can be reduced at the rate of about 0.5×Xs×p. In case of p=4, the whole area of the chip, which was 1.4 times in the conventional example, can be reduced to 0.8. In other words, the whole area of the chip can be reduced to about 60% of the conventional example.

The invention has thus been shown and described with reference to the specific embodiments. However, it should be noted that the present invention is in no way limited to the details of the illustrated structures but changes and modifications may be made within the scope of the appended claims.

I claim:

1. A decoding circuit for use in a semiconductor read only memory comprising:

a predecoding unit receiving a first address signal group of a given address, for selectively activating only one of a plurality of word selection driving signals; and a plurality of decoder blocks each including:

a selecting means receiving a second address signal group of said given address different from said first address signal group, and having an output for outputting an active first word selection control signal when a corresponding decoder block is designated by said second address signal group;

a word selecting means receiving said first word selection control signal and a third address signal group of said given address different from said first and second address signal groups, for generating second, third, fourth and fifth word selection control signals, said second and third word selection control signals being complementary to each other, said fourth and fifth word selection control signals being complementary to each other, said second and fifth word selection control signals being complementary to each other when said first word selection control signal is active but having the same logical condition when said first word selection control signal is inactive; and a plurality of decoding means each including a first series-circuit constituted of series-connected first, second, third and fourth transistors, which have their control electrode connected to receive said second, third, fourth and fifth word selection control signals, respectively, opposite ends of said first series-circuit being connected to receive a corresponding one of said word selection driving signals as a power supply source, a connection node between said second and third transistors being connected to a selected one of said output of said selecting means, a connection node between said first and second transistors generating a first word selecting signal, and a connection node between said third and fourth transistors generating a second word selecting signal, whereby only one of said word selecting signals is activated at a time.

2. A decoding circuit claimed in claim 1 wherein said first, second, third and fourth transistors are first, second, third and fourth NMOS transistors, respectively.

3. A decoding circuit claimed in claim 2 wherein each of said decoding means further includes a second series-circuit constituted of series-connected first, second, third and fourth PMOS transistors, which have their gate electrode connected to receive said third, second, fifth and fourth word selection control signals, respectively, opposite ends of said second series-circuit being connected to receive said corresponding one of said word selection driving signals as a power supply source, a connection node between said second and third PMOS transistors being connected to said connection node between said second and third NMOS transistors, a connection node between said first and second PMOS transistors being connected to said connection node between said first and second NMOS transistors, and a connection node between said third and fourth PMOS transistors being connected to said connection node between said third and fourth NMOS transistors.

4. A decoding circuit claimed in claim 2 wherein said connection node between said first and second transistors is connected to an input of a first inverter, which generates at its output said first word selecting signal, and said connection node between said third and fourth transistors is connected to an input of a second inverter, which generates at its output said second word selecting signal.

5. A decoding circuit for use in a semiconductor read only memory comprising:

a predecoding unit receiving a first address signal group of a given address, for selectively activating only one of a plurality of word selection driving signals; and a plurality of decoder blocks each including:

selecting means for receiving a second address signal group of said given address different from said first address signal group, and having an output for outputting an active first word selection control signal when a corresponding decoder block is designated by said second address signal group;

a word selecting means for receiving said first word selection control signal and a third address signal group of said given address different from said first and second address signal groups, for generating second, third, fourth and fifth word selection control signals, said second and third word selection control signals being complementary to each other, said fourth and fifth word selection control signals being complementary to each other, said second and fifth word selection control signals being complementary to each other when said first word selection control signal is active but having the same logical condition when said first word selection control signal is inactive; and a plurality of decoding means each including a first series-circuit constituted of series-connected first, second, third and fourth transistors, which have their control electrode connected to receive said second, third, fourth and fifth word selection control signals, respectively, opposite ends of said first series-circuit being connected to receive a corresponding one of said word selection driving signals as a power supply source, a connection node between said second and third transistors being connected to ground as another power supply source, a connection node between said first and second transistors generating a first word selecting signal, and a connection node between said third and fourth transistors generating a second word selecting signal, whereby only one of said word selecting signals is activated at a time.

6. A decoding circuit claimed in claim 5 wherein said first, second, third and fourth transistors are NMOS transistors, respectively.

* * * * *